(12) United States Patent
Fredriksson et al.

(10) Patent No.: US 11,349,493 B2
(45) Date of Patent: *May 31, 2022

(54) DIGITAL-TO-ANALOG CONVERSION CIRCUIT

(71) Applicant: Telefonaktiebolaget LM Ericsson (publ), Stockholm (SE)

(72) Inventors: Henrik Fredriksson, Lund (SE); Martin Anderson, Löddeköpinge (SE); Henrik Sjöland, Lund (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 0 days.

This patent is subject to a terminal disclaimer.

(21) Appl. No.: 17/228,900

(22) Filed: Apr. 13, 2021

(65) Prior Publication Data

US 2021/0234550 A1  Jul. 29, 2021

Related U.S. Application Data

(63) Continuation of application No. 16/605,426, filed as application No. PCT/EP2017/059787 on Apr. 25, 2017, now Pat. No. 11,005,493.

(51) Int. Cl.
  *H03M 1/66* (2006.01)
  *H03M 1/78* (2006.01)
  *H03M 1/80* (2006.01)
  *H04W 88/12* (2009.01)

(52) U.S. Cl.
  CPC .......... *H03M 1/662* (2013.01); *H03M 1/785* (2013.01); *H03M 1/802* (2013.01); *H04W 88/12* (2013.01)

(58) Field of Classification Search
  CPC ...... H03M 1/662; H03M 1/785; H03M 1/802; H03M 1/804; H04W 88/12
  USPC ................................................. 341/144–145
  See application file for complete search history.

(56) References Cited

U.S. PATENT DOCUMENTS

| | | | |
|---|---|---|---|
| 3,665,458 A | 5/1972 | Mulkey et al. | |
| 7,042,381 B1 | 5/2006 | Pan | |
| 7,126,519 B1 | 10/2006 | Xu | |
| 7,139,342 B1 | 11/2006 | Phanse | |
| 8,736,475 B1 | 5/2014 | Harrison | |
| 9,007,250 B1 | 4/2015 | Jeraj et al. | |
| 9,130,586 B1 | 9/2015 | Raz | |
| 9,136,865 B2 | 9/2015 | Kinyua | |
| 9,178,524 B1 * | 11/2015 | Lee ..................... | H03M 1/0881 |
| 9,853,686 B2 * | 12/2017 | Lee ........................ | H04B 1/525 |

(Continued)

OTHER PUBLICATIONS

Daanen, A.M.J., "Classification of digital-to-analog and analog-to-digital conversion techniques", Master's Thesis, Eindhoven University of Technology, 1987, 1-89.

*Primary Examiner* — Khai M Nguyen
(74) *Attorney, Agent, or Firm* — Murphy, Bilak & Homiller, PLLC

(57) ABSTRACT

A digital-to-analog conversion circuit (60) for converting a digital input sequence to an analog representation is disclosed. It comprises a first DAC, (100) wherein the first DAC (100) is of a capacitive voltage division type having a capacitive load (110). Furthermore, it comprises a second DAC (120) having a resistive load (130). An output (104) of the first DAC (100) and an output (124) of the second DAC (120) are connected, such that said capacitive load (110) and said resistive load (130) are connected in parallel.

23 Claims, 6 Drawing Sheets

(56) References Cited

U.S. PATENT DOCUMENTS

2008/0316076 A1 12/2008 Dent et al.
2015/0229323 A1 8/2015 Kinyua

* cited by examiner

DIGITAL-TO-ANALOG CONVERSION CIRCUIT

RELATED APPLICATIONS

This application is a continuation of U.S. patent application Ser. No. 16/605,426, filed Oct. 15, 2019, which was the National Stage of International Application No. PCT/EP2017/059787, filed Apr. 25, 2017, each of which is incorporated by reference in its entirety.

TECHNICAL FIELD

The present invention relates to digital-to-analog conversion.

BACKGROUND

A digital-to-analog converter (DAC) is an interface circuit between the digital domain and the analog domain, and serves to convert a digital signal representation to an analog signal representation. DACs may for instance be employed in transmitter circuits, wherein signals to be transmitted are generated in the digital domain, but need to be converted to the analog domain before transmission.

Several different DAC architectures have been developed over the years. In for example communications applications, requirements for frequency bandwidth have increased. Examples of approaches that have been suggested for enhancing DAC frequency bandwidth are disclosed e.g. in US 2008/0316076 A1, U.S. Pat. No. 7,042,381 B1, and U.S. Pat. No. 9,007,250 B1.

SUMMARY

Embodiments disclosed herein provide a digital-to-analog conversion circuit having a relatively wide bandwidth.

According to a first aspect, there is provided a digital-to-analog conversion circuit for converting a digital input sequence to an analog representation. It comprises a first DAC, wherein the first DAC is of a capacitive voltage division type having a capacitive load. Furthermore, it comprises a second DAC having a resistive load. An output of the first DAC and an output of the second DAC are connected, such that said capacitive load and said resistive load are connected in parallel.

The second DAC may be of a resistive voltage division type. For example, the second DAC may be an R-2R ladder DAC.

The second DAC may be of a switched current type.

The first DAC may be a C-2C ladder DAC.

In some embodiments, the first DAC and the second DAC are both configured to operate with said digital input sequence as input.

In other embodiments, the digital-to-analog conversion circuit comprises digital preprocessing circuitry configured to generate an input to the first DAC and/or an input of the second DAC based on said digital input sequence.

The first DAC may have a first frequency pass band and the second DAC may have a second frequency passband, such that the digital-to-analog conversion circuit overall has a continuous passband including the first frequency passband and the second frequency passband.

According to a second aspect, there is provided a transceiver circuit comprising the digital-to-analog conversion circuit of the first aspect.

According to a third aspect, there is provided a communication apparatus comprising the transceiver circuit of the second aspect. The communication apparatus may e.g. be a wireless communication device or a radio base station.

According to a fourth aspect, there is provided an electronic device comprising the digital-to-analog conversion circuit of the first aspect.

Further embodiments are defined in the dependent claims. It should be emphasized that the term "comprises/comprising" when used in this specification is taken to specify the presence of stated features, integers, steps, or components, but does not preclude the presence or addition of one or more other features, integers, steps, components, or groups thereof.

BRIEF DESCRIPTION OF THE DRAWINGS

Further objects, features and advantages of embodiments of the invention will appear from the following detailed description, reference being made to the accompanying drawings, in which.

DETAILED DESCRIPTION

Figure 1:
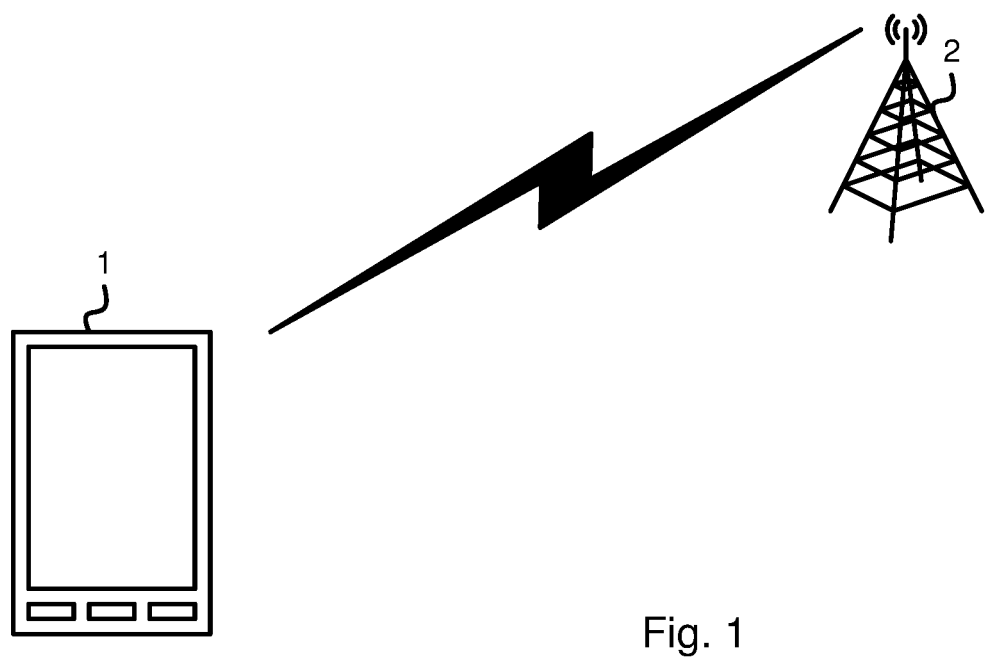
FIG. 1 illustrates a communication environment.

FIG. 1 illustrates a communication environment wherein embodiments of the present invention may be employed. A wireless communication device 1, or wireless device 1 for short, of a cellular communications system is in wireless communication with a radio base station 2 of the cellular communications system. The wireless device 1 may be what is generally referred to as a user equipment (UE). The wireless device 1 is depicted in FIG. 1 as a mobile phone, but may be any kind of device with cellular communication capabilities, such as a tablet or laptop computer, machine-type communication (MTC) device, or similar. Furthermore, a cellular communications system is used as an example throughout this disclosure. However, embodiments of the present invention may be applicable in other types of systems as well, such as but not limited to WiFi systems.

The radio base station 2 and wireless device 1 are examples of what in this disclosure is generically referred to as communication apparatuses. Embodiments are described below in the context of a communication apparatus in the form of the radio base station 2 or wireless device 1. However, other types of communication apparatuses can be considered as well, such as a WiFi access point or WiFi enabled device. Furthermore, embodiments of digital-to-analog conversion circuits described herein may be used in other types of electronic apparatuses than communication apparatuses as well.

Figure 2:
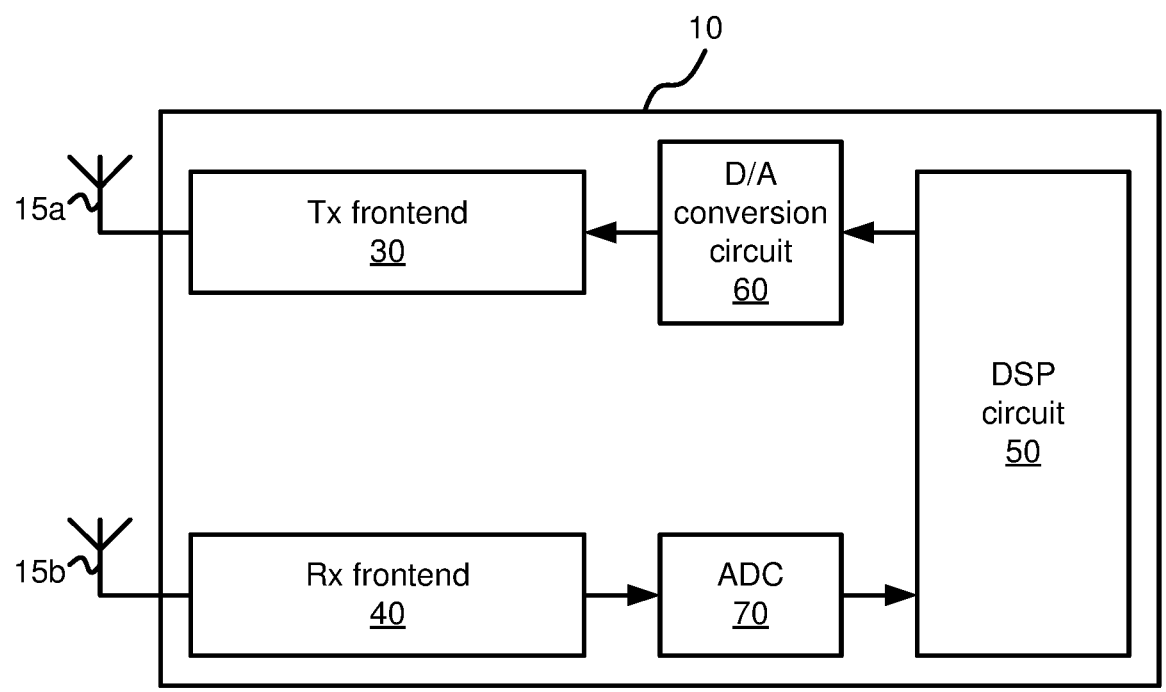
FIG. 2 illustrates a transceiver circuit.

FIG. 2 illustrates a simplified block diagram of a transceiver circuit 10, which may e.g. be comprised in any of the communication apparatuses 1 or 2. In FIG. 2, the transceiver circuit 10 is configured to transmit signals via a transmit antenna 15a and receive signals via a receive antenna 15b. It should be noted that this is merely an example. Various other antenna arrangements are possible as well, including multiple transmit or receive antennas, or one or more shared transmit and receive antennas. Furthermore, in FIG. 2, the transceiver circuit comprises a transmitter frontend circuit 30, connected to the transmit antenna 15a, and a receiver frontend circuit 40, connected to the receive antenna 15b. Moreover, in FIG. 2, the transceiver circuit 10 comprises a digital signal processing (DSP) circuit 50, such as a baseband processor. The DSP circuit 50 is configured to generate signals to be transmitted and process received signals in the digital domain. The transceiver circuit 10 further comprises a digital-to-analog (D/A) conversion circuit 60 configured to convert signals to be transmitted generated by the DSP circuit 50 from a digital to an analog representation, and provide the analog representation to the transmitter frontend 30 for transmission. The term "D/A conversion circuit" is used in this disclosure for the circuit 60, as a label, rather than the term "digital-to-analog converter" (DAC) simply to avoid confusion with DACs used as sub components in the circuit 60. However, since it performs a conversion from the digital to the analog domain, the circuit 60 could also be seen as a DAC.

The transceiver circuit 10 comprises an analog-to-digital converter (ADC) 70 configured to convert signals received via the receiver frontend 40 from an analog to a digital representation and provide the digital representation to the DSP circuit 50 for processing therein.

Figure 3:
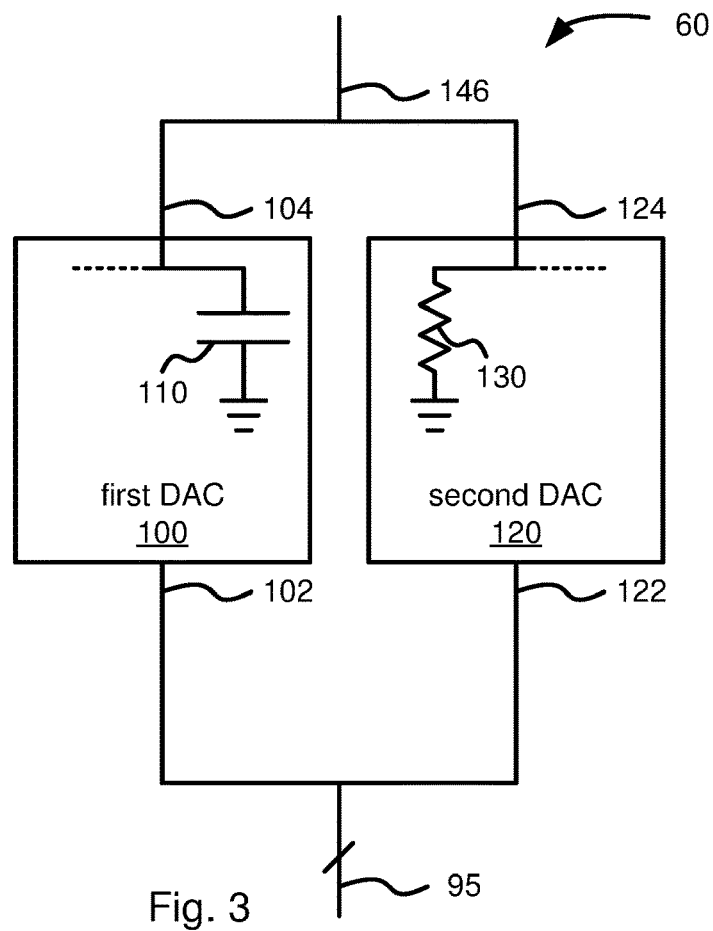
FIG. 3 is a block diagram of an embodiment of a digital-to-analog conversion circuit.

FIG. 3 is a simplified block diagram of an embodiment of the D/A conversion circuit 60, configured to convert a digital input sequence, input on a digital input 95, to an analog representation generated at an analog output 146. According to this embodiment, the D/A conversion circuit comprises a first DAC 100 and a second DAC 120. The first DAC 100 has a digital input 102 and an analog output 104. The first DAC 100 is of a capacitive voltage division type. DACs of capacitive voltage division type uses capacitive voltage division to properly scale the contributions to the output signal from the individual bit lines of the input of the DAC.

In FIG. 3, the first DAC 100 has a capacitive load 110 connected to the analog output 104. The capacitive load 110 may e.g. be a capacitor, which may be referred to as a load capacitor.

The inventors have realized that when a capacitive voltage division DAC, such as the first DAC 100, needs to drive a resistive load, a bandwidth limitation arises in that there is a frequency range between 0 Hz and a lower cut-off frequency in which the output from the capacitive voltage-division DAC is suppressed. The inventors have further realized that this can be counteracted by means of addition of the second DAC 120, as further described below, e.g. with reference to FIG. 4. Said resistive load is described below as being part of the second DAC 120, referred to with reference numeral 130.

The second DAC 120 has a digital input 122 and an analog output 124. It includes said resistive load 130 connected to the analog output 124. The resistive load 130 may e.g. be a resistor, which may be referred to as a load resistor.

The output 104 of the first DAC 100 and the output 124 of the second DAC 120 are connected. In FIG. 3, this is done by connecting both of them to the analog output 146 of the D/A conversion circuit 60. As a consequence, the capacitive load 110 of the first DAC 100 and the resistive load 130 of the second DAC 120 are connected in parallel.

In FIG. 3, the capacitive load 110 is connected between the analog output 104 and a ground node. This is merely an example, it could for instance be connected to any small signal ground node, i.e. any node having a constant reference voltage. Furthermore, the capacitive load 110 could, in a differential setting, be connected between output terminals of a differential output, as further elucidated below. Similarly, in FIG. 3, the resistive load 130 is connected between the analog output 124 and a ground node. Again, this is merely an example, it could for instance be connected to any small signal ground node, i.e. any node having a constant reference voltage, which may or may not be the same as that mentioned above for the capacitive load 110. Furthermore, the resistive load 130 could, in a differential setting, be connected between output terminals of a differential output, as further elucidated below.

Figure 4:
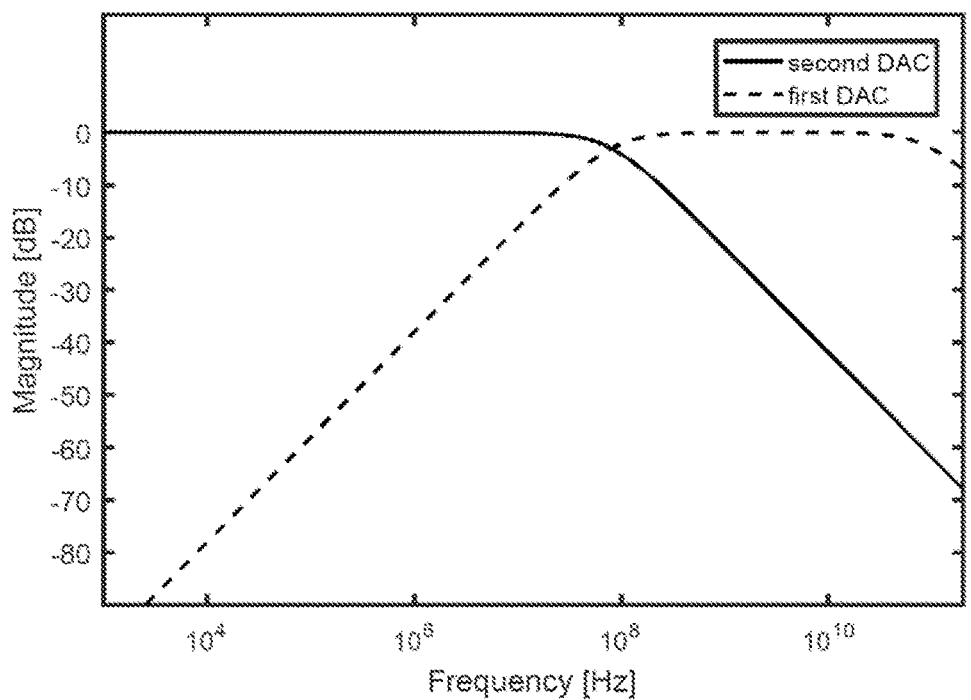
FIG. 4 illustrates magnitude functions.

A result of this connection is that the first DAC 100 and the second DAC 120, in some sense, has a common load, which is a parallel RC circuit formed by the capacitive load 110 and the resistive load 130. Due to this common RC load, the first DAC, which is of a capacitive voltage division type as stated above, will have effectively a band-pass characteristics with a lower 3 dB cut-off frequency roughly determined by the RC product of the common load (the upper 3 dB cut-off frequency is generally set by parasitics). Hence, there is a frequency band between 0 Hz (or "DC") and up in which the first DAC 100 cannot adequately generate signals. However, by proper selection of the second DAC 120, the second DAC 120 can be designed to have a low-pass characteristic with an upper 3 dB cut-off frequency also roughly determined by the RC product of the common load. Magnitude functions for the first DAC 100 (dashed) and the second DAC 120 (solid) according to an example are shown in FIG. 4. In this example, the lower 3 dB cut-off frequency of the first DAC 100 and the upper 3 dB cut-off frequency of the second DAC 120 coincides at around 100 MHz. Thus, the first DAC 100 has a first pass band and the second DAC 120 has a second passband, such that the D/A conversion circuit 60 overall has a continuous passband including the first passband and the second passband. Furthermore, in the example, the passband gains of the first DAC 100 and the second DAC 120 are approximately equal, resulting in an overall approximately flat magnitude function of the D/A-conversion circuit 60 within that overall continuous passband.

Figure 5:
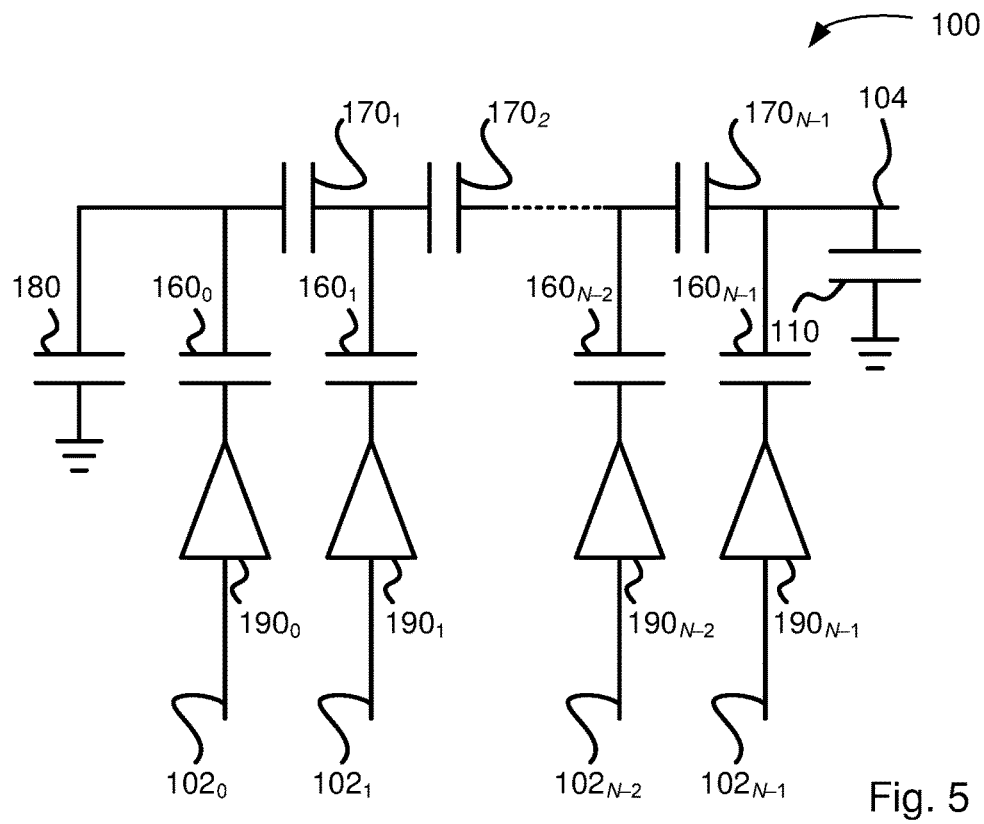
FIGS. 5-7 are circuit diagrams.

There are many alternative capacitive voltage-division DAC topologies that can be used for the first DAC 100. One example is the C-2C ladder DAC topology. FIG. 5 illustrates an embodiment of the first DAC 100 implemented as a C-2C ladder DAC. The capacitors $160_0$-$160_{N-1}$ and the capacitor 180 each have a capacitance C. The capacitors $170_1$-$170_{N-1}$ each have a capacitance 2C. Individual bit lines $102_j$, $j \in [0, 1, \ldots, N-1]$ where N is the number of bits, of the digital input 102 are shown in FIG. 5. Bit line $102_j$ is configured to receive a voltage representing a bit $b_j$ of a digital input word input to the first DAC 100. The digital input word represents a number $$X = \sum_{j=0}^{N-1} b_j w_j \quad (1)$$

where the bit weight $$w_j = 2^j \quad (2)$$

The representation of X given by (1) and (2) is one example that depends on the number system that is used in the digital domain. For example, the right hand side of (1) could be subject to a scaling factor and an offset, yielding another possible representation of X. With the notation used herein, $b_0$ is the least significant bit and $b_{N-1}$ is the most significant bit. For each bit $b_j$, the embodiment of the first DAC 100 shown in FIG. 5 comprises a buffer driver 190$_j$ connecting the bit line 102 with one end of the capacitor 160$_j$.

The capacitor ladder structure shown in FIG. 5 ideally provides an output voltage at the output 104 that is proportional to X (possible with the addition of an offset value) through the principles of capacitive voltage division, to scale the contributions from the different bit lines 102 according to the bit weights $w_j$, and superposition, to combine said scaled contributions. Details of the principle of the function of C-2C ladder DACs are known to persons skilled in the art of DAC design, e.g. from U.S. Pat. No. 3,665,458, and are not presented in any further detail herein.

According to some embodiments, the second DAC 120 is of a resistive voltage division type. DACs of resistive voltage division type uses resistive voltage division to properly scale the contributions from individual bit lines of the input of the DAC.

Figure 6:
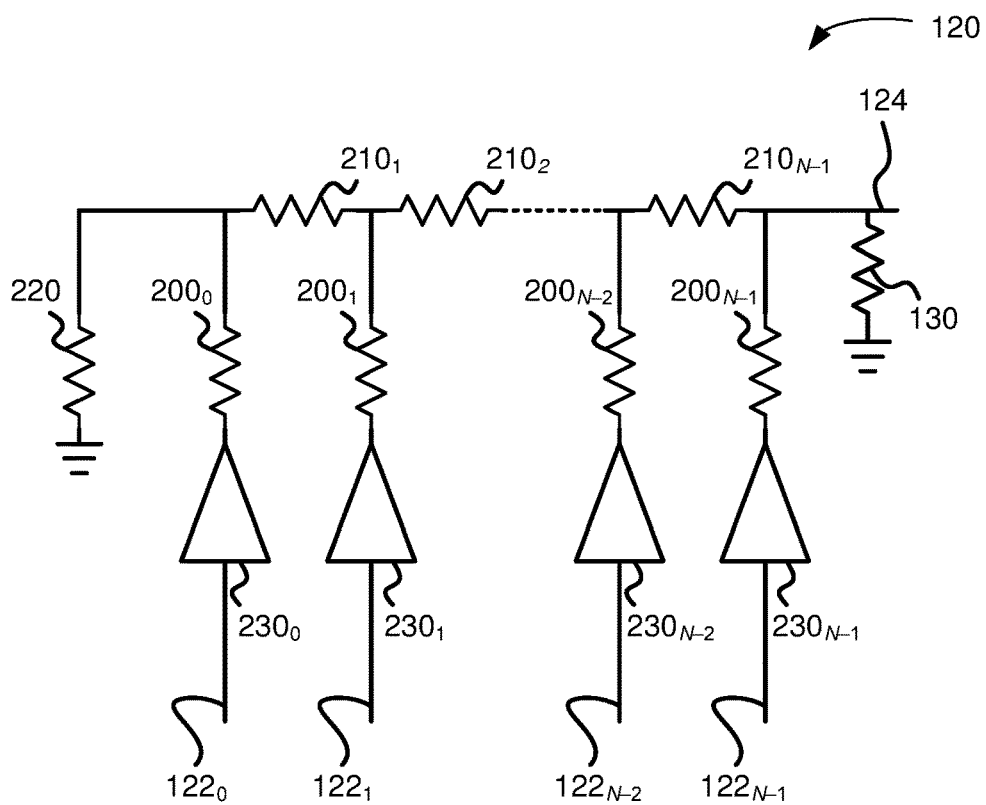

There are many alternative resistive voltage-division DAC topologies that can be used for the second DAC 120. One example is the R-2R ladder DAC topology. FIG. 6 illustrates an embodiment of the second DAC 120 implemented as an R-2R ladder DAC. The resistors 200$_0$-200$_{N-1}$ and the resistor 220 each have a resistance 2R. The resistors 210$_1$-210$_{N-1}$ each have a resistance R. Individual bit lines 122$_j$, $j \in [0, 1, N-1]$ where again N is the number of bits, of the digital input 122 are shown in FIG. 6. Similarly to the C2C ladder DAC described with reference to FIG. 5, bit line 122$_j$ is configured to receive a voltage representing a bit $b_1$ of a digital input word input to the second DAC 120. The bits and the number they represent are described above, and this description is not repeated here. In some embodiments, as that depicted in FIG. 3, bit line 102$_j$ and bit line 122$_j$ may be configured to receive the same bit $b_j$. In other embodiments, different processing may be applied to generate the input of the first DAC 100 and the input to second DAC 120 from the input 95 to the D/A conversion circuit 60, e.g. as elucidated below with reference to FIG. 10.

For each bit $b_j$, the embodiment of the second DAC 120 shown in FIG. 6 comprises a buffer driver 230$_j$ connecting the bit line 122$_j$ with one end of the resistor 200$_j$.

The resistor ladder structure shown in FIG. 6 ideally provides an output voltage at the output 124 that is proportional to X (possible with the addition of an offset value) through the principles of resistive voltage division, to scale the contributions from the different bit lines 122$_j$ according to the bit weights $w_j$, and superposition, to combine said scaled contributions. Details of the principle of the function of R-2R ladder DACs are known to persons skilled in the art of DAC design, and are not presented in any further detail herein.

Another alternative, which is used in some embodiments, is to implement the second DAC 120 as a DAC of switched current type (or "current steering"). A DAC of switched current type operates by summing currents from weighted current sources, which are switched in to a summing node based on the values of input bits.

Figure 7:
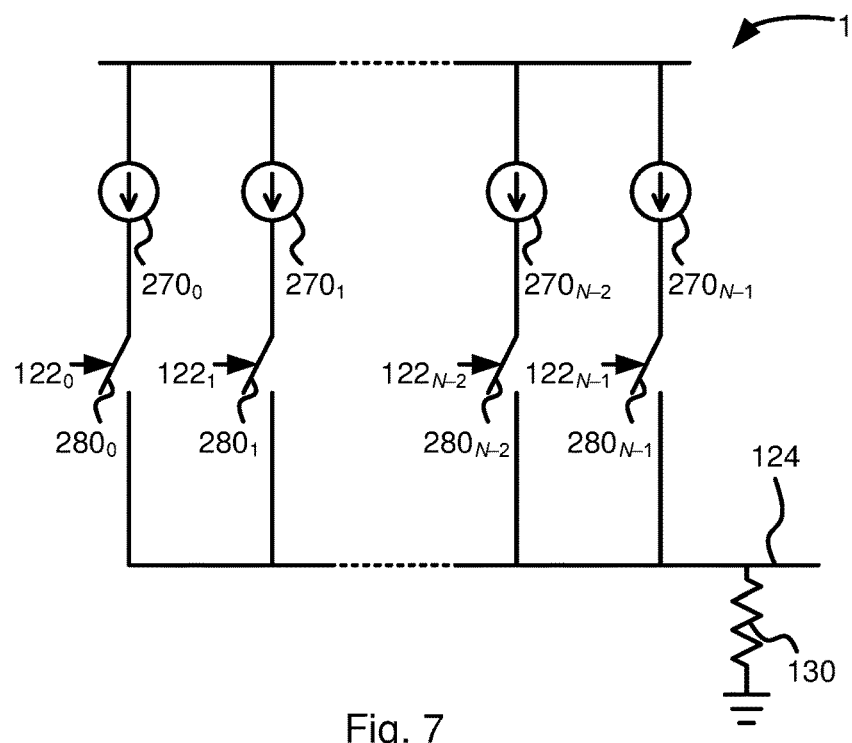

FIG. 7 illustrates an embodiment of the second DAC 120 implemented as a switched-current type DAC. In FIG. 7, the second DAC 120 comprises N current sources 270$_0$-270$_{N-1}$ and N switches 270$_0$-270$_{N-1}$. The current source 270 is configured to output a current $I_j = I_{unit} w_j$, where $I_{unit}$ is a unit current. The switched current DAC may be binary weighted, where $w_1 = 2^j$ as in (2) above. However, other number representations with other bit weights may be used as well. The switch 280$_j$ is connected between the current source 270$_j$ and the output 124. The switch 280$_j$ is controlled by the bit $b_1$ received on bit line 122$_j$ such that the switch is closed when $b_j = 1$ and open when $b_j = 0$.

Details of the principle of the function of switched current DACs are known to persons skilled in the art of DAC design, and are not presented in any further detail herein.

Figure 8:
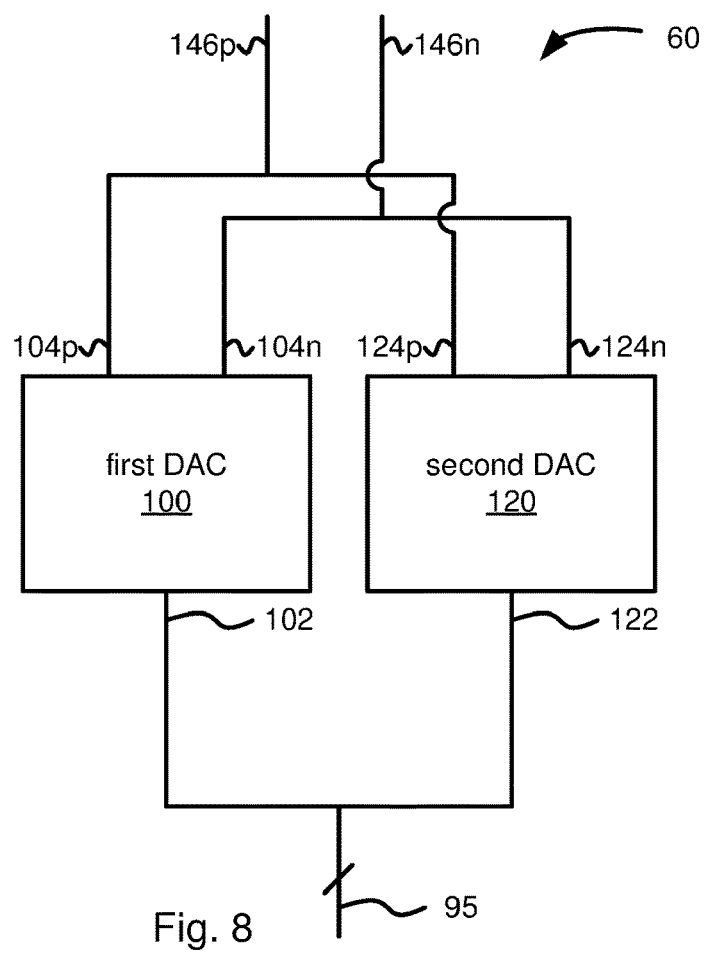
FIG. 8 is a block diagram of an embodiment of a digital-to-analog conversion circuit.

In FIG. 3, the D/A-conversion circuit 60 is illustrated as a single-ended circuit. However, in some embodiments, the D/A-conversion circuit 60 has a differential output, e.g. as depicted in FIG. 8. In the embodiment illustrated in FIG. 8, the output 104 of the first DAC 100 has a first ("positive") output terminal 104$p$ and a second ("negative") output terminal 104$n$. Similarly, the output 124 of the second DAC 120 has a first ("positive") output terminal 124$p$ and a second ("negative") output terminal 124$n$. Furthermore, the output 146 of the D/A-conversion circuit 60 has a first ("positive") output terminal 146$p$ and a second ("negative") output terminal 146$n$. The terminals 104$p$ and 124$p$ are connected. In FIG. 8, this is done by connecting both of them to the terminal 146$p$. Similarly, the terminals 104$n$ and 124$n$ are connected. In FIG. 8, this is done by connecting both of them to the terminal 146$n$.

Figure 9:
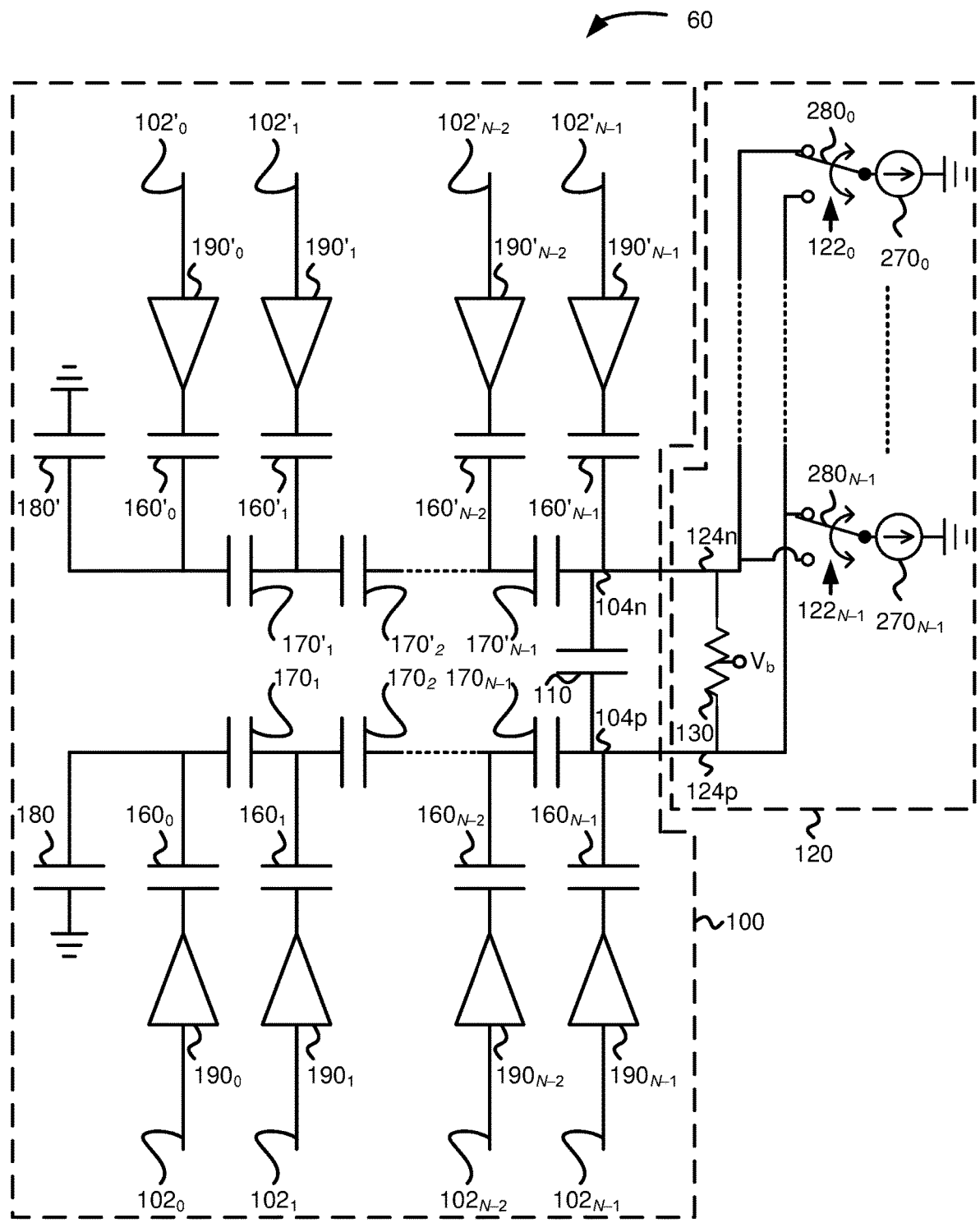
FIG. 9 is a circuit diagram.

FIG. 9 illustrates, in a little more detail, an embodiment of the D/A-conversion circuit 60 having a differential output. In this embodiment, the second DAC 120 is of a switched current type. Furthermore, the first DAC 100 is a differential version of the C-2C ladder DAC in FIG. 5. It comprises the components 160$_j$, 170$_j$, 180, and 190$_j$, as in FIG. 5, connected to the output terminal 104$p$ and input bit lines 102$_j$. Furthermore, it comprises identical copies of these components, which are denoted with primed reference numbers 160'$_j$, 170'$_j$, 180', and 190'$_j$, which are connected to the output terminal 104$n$ and complementary input bit lines 102'$_j$. The complementary input bit lines 102'$_j$ are configured to receive voltages representing the inverses $\overline{b}_j$ of the bits $b_j$. The first DAC 100 may comprise inverters (not shown) for generating said inverses. In the embodiment illustrated in FIG. 9, the capacitive load 110 is connected between the output terminal 104$p$ and the output terminal 104$n$.

In FIG. 9, the differential second DAC of switched current type is implemented similar to the single ended version in FIG. 7. Each switch 280$_j$ is implemented as a differential switch, steering the current from current source 270$j$ either towards the output terminal 124$p$ or towards the output terminal 124$n$, depending on the value of the bit $b_j$. Furthermore, in FIG. 9, the resistive load 130 is connected between the output terminal 124$p$ and the output terminal 124$n$. In this embodiment, the resistive load 130 has a center tap connected to a bias node and configured to receive a bias voltage $V_b$. This can be viewed as that the resistive load 130 is split into a first resistor and a second resistor, where the first resistor is connected between the output terminal 124$p$ and the bias node, and the second resistor is connected between the output terminal 124$n$ and the bias node. It should be noted that a similar implementation of the capacitive load 110 is possible. That is, the capacitive load can be implemented with a first capacitor connected between the output terminal 104$p$ and a common node, and a second capacitor connected between the output terminal 104$n$ and the common node. The common node may be configured to receive a bias voltage, which may or may not be the bias voltage $V_b$.

The functionality of the differential circuitry illustrated in FIG. 9 would be readily understood by a person skilled in DAC design, and is not described in further detail herein.

Above, embodiments of the D/A-conversion circuit 60 have been described wherein the first DAC 100 and the second DAC 120 are both configured to operate with the same digital input sequence as input. In some embodiments, the D/A conversion circuit 60 comprises digital preprocessing circuitry configured to generate an input to the first DAC 100 and/or an input of the second DAC 120 based on said digital input sequence. For example, the first DAC 100 and the second DAC 120 may be configured to operate with different sample rates. Alternatively or additionally, signal content that would anyway be suppressed by the frequency-selective characteristic of the respective DAC 100, 120, can be filtered out already before the signal is input to the respective DAC 100, 120.

Figure 10:
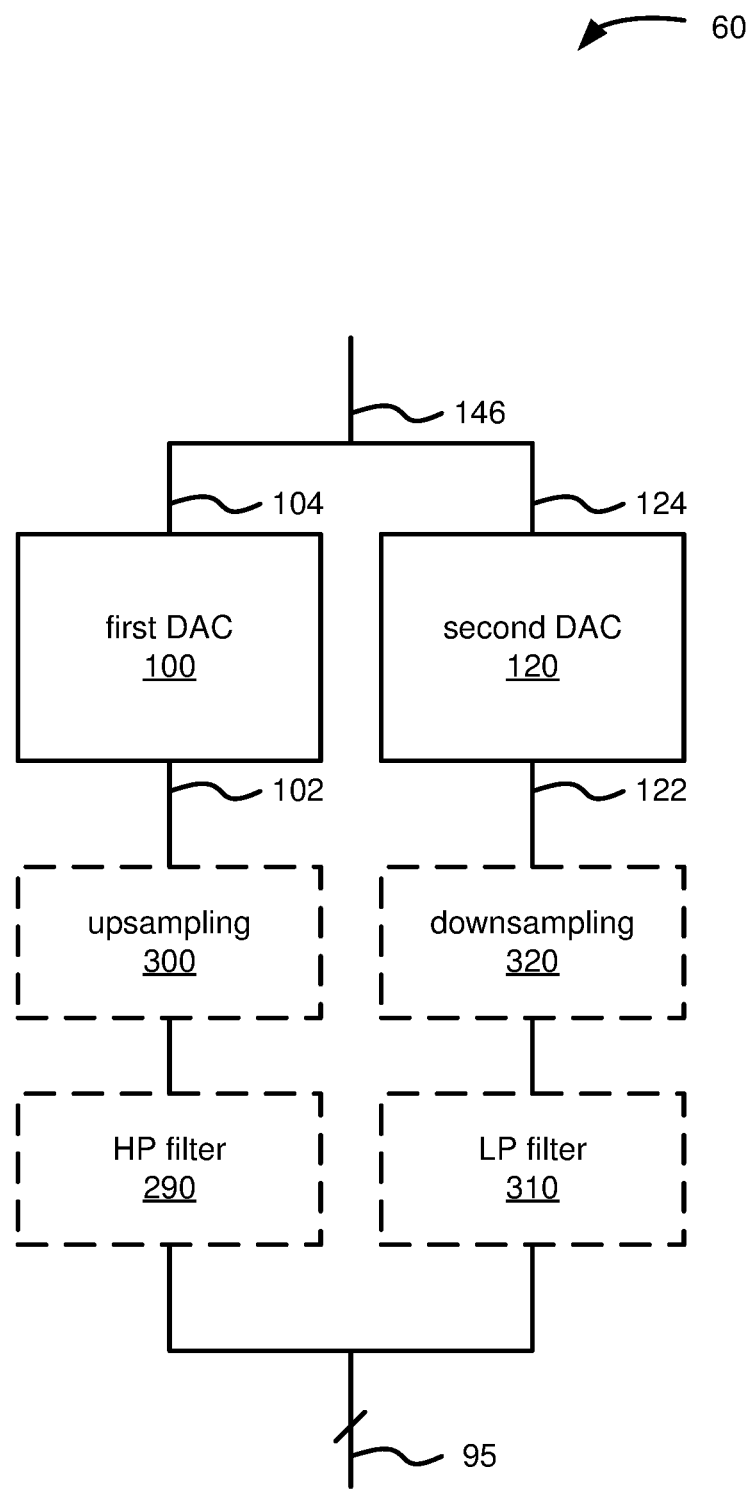
FIG. 10 is a block diagram of an embodiment of a digital-to-analog conversion circuit.

Examples of digital preprocessing circuitry are shown in FIG. 10. As illustrated in FIG. 10, the digital preprocessing circuitry may e.g. comprise a high-pass (HP) filter 290 and an upsampling circuit 300 configured to generate the input to the first DAC 100. Furthermore, as illustrated in FIG. 10, the digital preprocessing circuitry may e.g. comprise a low-pass (LP) filter 310 and a downsampling circuit 320 configured to generate the input to the second DAC 120.

The present invention has been described above with reference to specific embodiments. However, other embodiments than the above described are possible within the scope of the invention. The different features of the embodiments may be combined in other combinations than those described. For example, embodiments of the digital-to-analog conversion circuit 60 may be used in any type of electronic device wherein conversion from a digital to an analog representation is needed, and not only the depicted communication apparatuses 1 and 2.

What is claimed is:

1. A digital-to-analog conversion circuit for converting a digital input sequence to an analog representation, the digital-to-analog conversion circuit comprising:
    a first digital-to-analog converter, DAC having a first positive output terminal and a first negative output terminal, wherein the first DAC is of a capacitive voltage division type having a capacitive load connected between the first positive output terminal and the first negative output terminal; and
    a second DAC having a second positive output terminal, a second negative output terminal, and a resistive load connected between the second positive output terminal and the second negative output terminal;
    wherein the first and second positive output terminals are connected;
    wherein the first and second negative output terminals are connected.

2. The digital-to-analog conversion circuit of claim 1, wherein the first DAC comprises:
    a first C-2C capacitor ladder network driven by a first set of input bit lines configured to receive voltages representing bits of the digital input sequence, wherein an output of the first C-2C capacitor ladder network is connected to the first positive output terminal; and
    a second C-2C capacitor ladder network driven by a second set of input bit lines configured to receive voltages representing the inverse of the bits of the digital input sequence, wherein an output of the second C-2C capacitor ladder network is connected to the first negative output terminal.

3. The digital-to-analog conversion circuit of claim 2, wherein the second DAC is of a switched current type.

4. The digital-to-analog conversion circuit of claim 3, wherein the second DAC comprises:
    a set of weighted current sources; and
    a set of differential switches, wherein each differential switch in the set steers current from a respective weighted current source either towards the second positive output terminal or towards the second negative output terminal, depending on a value of a respective bit of the digital input sequence.

5. The digital-to-analog conversion circuit of claim 1, wherein the second DAC is of a switched current type.

6. The digital-to-analog conversion circuit of claim 5, wherein the second DAC comprises:
    a set of weighted current sources; and
    a set of differential switches, wherein each differential switch in the set steers current from a respective weighted current source either towards the second positive output terminal or towards the second negative output terminal, depending on a value of a respective bit of the digital input sequence.

7. The digital-to-analog conversion circuit of claim 1, wherein the resistive load has a center tap connected to a bias node and configured to receive a bias voltage.

8. The digital-to-analog conversion circuit of claim 1, wherein the second DAC is of a switched current type and wherein the first DAC is a C-2C ladder DAC.

9. The digital-to-analog conversion circuit of claim 1, wherein the first DAC is a C-2C ladder DAC.

10. The digital-to-analog conversion circuit of claim 1, further comprising a positive output terminal and a negative output terminal, wherein the first and second positive output terminals are connected by each being connected to the positive output terminal of the digital-to-analog conversion circuit, and wherein the first and second negative output terminals are connected by each being connected to the negative output terminal of the digital-to-analog conversion circuit.

11. A transceiver circuit comprising a digital-to-analog conversion circuit for converting a digital input sequence to an analog representation, the digital-to-analog conversion circuit comprising:
    a first digital-to-analog converter, DAC having a first positive output terminal and a first negative output terminal, wherein the first DAC is of a capacitive voltage division type having a capacitive load connected between the first positive output terminal and the first negative output terminal; and
    a second DAC having a second positive output terminal, a second negative output terminal, and a resistive load connected between the second positive output terminal and the second negative output terminal;
    wherein the first and second positive output terminals are connected;
    wherein the first and second negative output terminals are connected.

12. A communication apparatus comprising a transceiver circuit, wherein the transceiver circuit comprises a digital-to-analog conversion circuit for converting a digital input sequence to an analog representation, the digital-to-analog conversion circuit comprising:
    a first digital-to-analog converter, DAC having a first positive output terminal and a first negative output terminal, wherein the first DAC is of a capacitive voltage division type having a capacitive load connected between the first positive output terminal and the first negative output terminal; and
    a second DAC having a second positive output terminal, a second negative output terminal, and a resistive load connected between the second positive output terminal and the second negative output terminal;

wherein the first and second positive output terminals are connected;

wherein the first and second negative output terminals are connected.

13. The communication apparatus of claim 12, wherein the communication apparatus is a wireless communication device.

14. The communication apparatus of claim 12, wherein the communication apparatus is a radio base station.

15. The communication apparatus of claim 12, wherein the first DAC comprises:

a first C-2C capacitor ladder network driven by a first set of input bit lines configured to receive voltages representing bits of the digital input sequence, wherein an output of the first C-2C capacitor ladder network is connected to the first positive output terminal; and a second C-2C capacitor ladder network driven by a second set of input bit lines configured to receive voltages representing the inverse of the bits of the digital input sequence, wherein an output of the second C-2C capacitor ladder network is connected to the first negative output terminal.

16. The communication apparatus of claim 15, wherein the second DAC is of a switched current type.

17. The communication apparatus of claim 16, wherein the second DAC comprises:

a set of weighted current sources; and a set of differential switches, wherein each differential switch in the set steers current from a respective weighted current source either towards the second positive output terminal or towards the second negative output terminal, depending on a value of a respective bit of the digital input sequence.

18. The communication apparatus of claim 12, wherein the second DAC is of a switched current type.

19. The communication apparatus of claim 18, wherein the second DAC comprises:

a set of weighted current sources; and a set of differential switches, wherein each differential switch in the set steers current from a respective weighted current source either towards the second positive output terminal or towards the second negative output terminal, depending on a value of a respective bit of the digital input sequence.

20. The communication apparatus of claim 12, wherein the resistive load has a center tap connected to a bias node and configured to receive a bias voltage.

21. The communication apparatus of claim 12, wherein the second DAC is of a switched current type and wherein the first DAC is a C-2C ladder DAC.

22. The communication apparatus of claim 12, wherein the first DAC is a C-2C ladder DAC.

23. The communication apparatus of claim 12, wherein the digital-to-analog conversion circuit further comprises a positive output terminal and a negative output terminal, wherein the first and second positive output terminals are connected by each being connected to the positive output terminal of the digital-to-analog conversion circuit, and wherein the first and second negative output terminals are connected by each being connected to the negative output terminal of the digital-to-analog conversion circuit.

* * * * *